United States Patent
Demirer et al.

(10) Patent No.: US 10,444,639 B2
(45) Date of Patent: Oct. 15, 2019

(54) LAYER-TO-LAYER FEEDFORWARD OVERLAY CONTROL WITH ALIGNMENT CORRECTIONS

(71) Applicant: KLA-Tencor Corporation, Milpitas, CA (US)

(72) Inventors: Onur Nihat Demirer, Austin, TX (US); William Pierson, Austin, TX (US); Mark D. Smith, San Jose, CA (US); Jeremy S. Nabeth, Austin, TX (US); Miguel Garcia-Medina, Round Rock, TX (US); Lipkong Yap, Saratoga Springs, NY (US)

(73) Assignee: KLA-Tencor Corporation, Milpitas, CA (US)

( * ) Notice: Subject to any disclaimer, the term of this patent is extended or adjusted under 35 U.S.C. 154(b) by 25 days.

(21) Appl. No.: 15/843,371

(22) Filed: Dec. 15, 2017

(65) Prior Publication Data

US 2018/0253016 A1    Sep. 6, 2018

Related U.S. Application Data

(60) Provisional application No. 62/465,164, filed on Mar. 1, 2017.

(51) Int. Cl.
G03F 7/20 (2006.01)
H01L 21/027 (2006.01)
G03F 9/00 (2006.01)

(52) U.S. Cl.
CPC .......... *G03F 7/70633* (2013.01); *G03F 7/705* (2013.01); *G03F 7/70258* (2013.01); *G03F 9/7046* (2013.01); *H01L 21/0274* (2013.01)

(58) Field of Classification Search
CPC .. G03F 7/70633; G03F 7/70258; G03F 7/705; G03F 9/7046; H01L 21/0274
USPC ..................................................... 430/22, 30
See application file for complete search history.

(56) References Cited

U.S. PATENT DOCUMENTS

| | | |
|---|---|---|
| 2003/0027368 A1 | 2/2003 | Baluswamy et al. |
| 2004/0049762 A1 | 3/2004 | Peng et al. |
| 2005/0095515 A1 | 5/2005 | Pellegrini |
| 2008/0259297 A1 | 10/2008 | Kawakubo |
| 2012/0022679 A1 | 1/2012 | Choi et al. |

OTHER PUBLICATIONS

Timothy H. Conway et al., Crow, Effect of overlay APC control on cascading levels: perturbations of the reference level. Proc. SPIE 5038, Metrology, Inspection, and Process Control for Microlithography XVII, 1002 (May 27, 2003); doi:10.1117/12.484999.
David A. Crow et al., Application of feedforward reticle: offset for overlay APC in a highpart-count fab. Proc. SPIE 4689, Metrology, Inspection, and Process Control for Microlithography XVI, 1151 (Jul. 1, 2002); doi:10.1117/12.473443.
B. Orlando et al., Overlay improvement through lot-based feedforward: applications to various 28nm node lithography operations. Proc. SPIE 8681, Metrology, Inspection, and Process Control for Microlithography XXVII, 868117 (Apr. 10, 2013); doi:10.1117/12.2011117.
Richard Van Haren et al., Higher order feed-forward control of reticle writing error fingerprints. Proc. SPIE 9635, Photomask Technology 2015, 963507 (Oct. 23, 2015); doi:10.1117/12.2197556.
International Search Report dated Jun. 4, 2018 for PCT/US2018/020341.

*Primary Examiner* — Christopher G Young
(74) *Attorney, Agent, or Firm* — Suiter Swantz pc llo

(57) ABSTRACT

A process control system includes a controller configured to generate a reference overlay signature based on one or more overlay reference layers of a sample, extrapolate the reference overlay signature to a set of correctable fields for the exposure of a current layer of the sample to generate a full-field reference overlay signature, identify one or more alignment fields of the set of correctable fields, generate an alignment-correctable signature by modeling alignment corrections for the set of correctable fields, subtract the alignment-correctable signature from the full-field reference overlay signature to generate feedforward overlay corrections for the current layer when the one or more overlay reference layers are the same as the one or more alignment reference layers, generate lithography tool corrections based on the feedforward overlay corrections, and provide the lithography tool corrections for the current layer to the lithography tool.

39 Claims, 10 Drawing Sheets

LAYER-TO-LAYER FEEDFORWARD OVERLAY CONTROL WITH ALIGNMENT CORRECTIONS

CROSS-REFERENCE TO RELATED APPLICATION

The present application claims the benefit under 35 U.S.C. § 119(e) of U.S. Provisional Application Ser. No. 62/465,164, filed Mar. 1, 2017, entitled LAYER-TO-LAYER SMART OVERLAY FEEDFORWARD CONTROL, naming Onur Nihat Demirer, Bill Pierson, Mark D. Smith, Jeremy S. Nabeth, Miguel Garcia-Medina, and Lipkong Yap as inventors, which is incorporated herein by reference in the entirety.

TECHNICAL FIELD

The present disclosure is directed generally to overlay control systems and, more particularly, to overlay control systems with layer-to-layer feedforward control.

BACKGROUND

Semiconductor devices typically include a stack of patterned layers formed from a series of processing steps including deposition, lithographic exposure of a desired pattern, and etching exposed or unexposed portions. The exposure step for a given layer is typically divided into a grid of exposure fields such that a lithography tool separately exposes each field.

Lithography overlay represents the alignment error, or misregistration, between two or more layers. Overlay errors may result from varied sources such as systematic bias from fabrication tools, stochastic errors, or sample variations. Further, overlay errors may vary systematically or randomly across a sample for each exposure field. Overlay errors are typically mitigated and/or compensated for during production by tightly controlling the configuration of the lithography tool for each exposure field. For example, the lithography tool may align the reticle to the sample based on measurements of alignment targets already fabricated on the sample. Further, the lithography tool may employ additional overlay corrections based on overlay measurements of overlay targets.

Some control systems may utilize feed-forward data from a reference layer including alignment and/or overlay targets. However, a control system based on both alignment corrections from alignment targets and overlay corrections from overlay targets may produce cross-talk that results in over-correction and instability, particularly when reference layers for alignment and overlay are the same. Further, typical control systems may not be suitable for advanced overlay control schemes such as those utilizing different types of reference targets from one layer to the next or those utilizing distinct reference layers for each measurement direction.

Therefore, it may be desirable to provide systems and methods for providing stable overlay control for multiple configurations of alignment and overlay reference layers.

SUMMARY

A process control system is disclosed in accordance with one or more illustrative embodiments of the present disclosure. In one illustrative embodiment, the system includes a controller. In another illustrative embodiment, the controller generates a reference overlay signature based on one or more overlay reference layers of a sample using overlay models for the one or more overlay reference layers. In another illustrative embodiment, the controller extrapolates the reference overlay signature to a set of correctable fields for the exposure of a current layer of the sample to generate a full-field reference overlay signature. In another illustrative embodiment, the controller identifies one or more alignment fields of the set of correctable fields including alignment targets to be used for alignment of a lithography tool for exposing the current layer. In another illustrative embodiment, the controller generates an alignment-correctable signature by modeling alignment corrections for the set of correctable fields based on data from the full-field reference overlay signature in the one or more alignment fields using an alignment model for the current layer. In another illustrative embodiment, the controller subtracts the alignment-correctable signature from the full-field reference overlay signature to generate feedforward overlay corrections for the current layer when the one or more overlay reference layers are the same as the one or more alignment reference layers. In another illustrative embodiment, the controller generates lithography tool corrections based on the feedforward overlay corrections. In another illustrative embodiment, the controller provides the lithography tool corrections for the current layer to the lithography tool.

A system is disclosed in accordance with one or more illustrative embodiments of the present disclosure. In one illustrative embodiment, the system includes a controller. In another illustrative embodiment, the controller generates a reference overlay signature based on one or more overlay reference layers of a sample using overlay models for the one or more overlay reference layers. In another illustrative embodiment, the controller extrapolates the reference overlay signature to a set of correctable fields for the exposure of a current layer of the sample to generate a full-field reference overlay signature. In another illustrative embodiment, the controller identifies one or more alignment fields of the set of correctable fields including alignment targets to be used for alignment of a lithography tool for exposing the current layer. In another illustrative embodiment, the controller generates an alignment-correctable signature by modeling alignment corrections for the set of correctable fields based on data from the full-field reference overlay signature in the one or more alignment fields using an alignment model for the current layer. In another illustrative embodiment, the controller subtracts the alignment-correctable signature from the full-field reference overlay signature to generate feedforward overlay corrections for the current layer when the one or more overlay reference layers are the same as the one or more alignment reference layers. In another illustrative embodiment, the controller generates lithography tool corrections based on the feedforward overlay corrections. In another illustrative embodiment, the controller provides the feed-forward corrections to the process control system for adjusting the lithography tool for exposing the current layer.

A process control system is disclosed in accordance with one or more illustrative embodiments of the present disclosure. In one illustrative embodiment, the system includes a lithography tool. In another illustrative embodiment, the system includes a controller. In another illustrative embodiment, the controller generates a reference overlay signature based on one or more overlay reference layers of a sample using overlay models for the one or more overlay reference layers. In another illustrative embodiment, the controller extrapolates the reference overlay signature to a set of correctable fields for the exposure of a current layer of the sample to generate a full-field reference overlay signature. In another illustrative embodiment, the controller identifies one or more alignment fields of the set of correctable fields including alignment targets to be used for alignment of a lithography tool for exposing the current layer. In another illustrative embodiment, the controller generates an alignment-correctable signature by modeling alignment corrections for the set of correctable fields based on data from the full-field reference overlay signature in the one or more alignment fields using an alignment model for the current layer. In another illustrative embodiment, the controller subtracts the alignment-correctable signature from the full-field reference overlay signature to generate feedforward overlay corrections for the current layer when the one or more overlay reference layers are the same as the one or more alignment reference layers. In another illustrative embodiment, the controller generates lithography tool corrections based on the feedforward overlay corrections. In another illustrative embodiment, the controller provides the lithography tool corrections for the current layer to the lithography tool.

A method for determining feed forward data is disclosed in accordance with one or more illustrative embodiments of the present disclosure. In one illustrative embodiment, the method includes generating reference overlay signature based on one or more overlay reference layers of a sample using overlay models for the one or more overlay reference layers. In another illustrative embodiment, the method includes extrapolating the reference overlay signature to a set of correctable fields for the exposure of a current layer of the sample to generate a full-field reference overlay signature. In another illustrative embodiment, the method includes identifying one or more alignment fields of the set of correctable fields including alignment targets to be used for alignment of a lithography tool for exposing the current layer. In another illustrative embodiment, the method includes generating an alignment-correctable signature by modeling alignment corrections for the set of correctable fields based on data from the full-field reference overlay signature in the one or more alignment fields using an alignment model for the current layer. In another illustrative embodiment, the method includes subtracting the alignment-correctable signature from the full-field reference overlay signature to generate feedforward overlay corrections for the current layer when the one or more overlay reference layers are the same as the one or more alignment reference layers. In another illustrative embodiment, the method includes generating lithography tool corrections based on the feedforward overlay corrections. In another illustrative embodiment, the method includes providing the lithography tool corrections for the current layer to the lithography tool.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
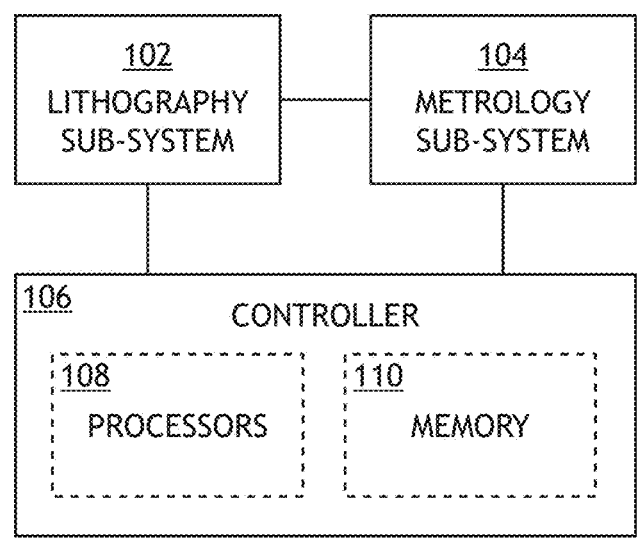
FIG. 1A is a conceptual view of a semiconductor device fabrication system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for process control based on feedback data and layer-to-layer feedforward data, where the feedforward data includes both alignment and overlay data, and is dynamically generated based on the locations of reference layers for the alignment and overlay measurements to reduce overcorrection. Feedback data for the control of fabrication tools (e.g., lithography tools, etching tools, or the like) may be generated based on previous production runs of the fabrication of a current layer. Feedforward data may be generated based on metrology targets fabricated on one or more previously-fabricated layers. For example, measurements of alignment metrology targets may facilitate alignment of a lithography tool to a sample for exposure of a current layer. Further, measurements of overlay metrology targets may indicate overlay errors in previous layers that may impact desired exposure conditions of the current layer for reducing overlay.

However, it is recognized herein that feedforward data based on both alignment data and overlay data may result in overcorrections that may induce control instability or noise, particularly when reference layers including alignment and overlay metrology targets coincide. Accordingly, embodiments of the present disclosure are directed to subtracting alignment-correctable data from overlay-based lithography tool corrections to reduce and/or mitigate overcorrections. In this regard, feedforward data in a process control system may include independent overlay-based corrections and alignment-based corrections, which may provide highly accurate and stable process control with tight overlay tolerances.

A semiconductor device may typically include multiple layers of patterned or unpatterned material on a substrate. Each layer may be fabricated through a series of process steps such as, but not limited to, one or more material deposition steps, one or more lithography steps, or one or more etching steps. Further, each layer must be fabricated within specific tolerances to properly construct the final device. For example, overlay errors representing misregistrations between fabricated layers must typically be tightly controlled to ensure proper overlap of fabricated patterns and ultimately device performance. Additionally, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. For the purposes of the present disclosure, the terms sample and wafer should be interpreted as interchangeable.

Overlay errors may be introduced through varied sources. For example, overlay errors may be generated by grid errors associated with alignment of a reticle to the sample during an exposure step of one or more exposure fields. A lithography tool (e.g., a stepper, a scanner, or the like) may typically have a field of view (FOV) smaller than a full sample and may thus divide the sample into a series (e.g., a grid) of exposure fields (hereinafter referred to as fields) that may be separately exposed. Accordingly, grid errors may include misalignments of the reticle to the sample for each field in an exposure grid (e.g., grid errors), which may manifest as shifts of an exposure pattern of a current layer relative to a nominal location on the sample for each field. By way of another example, overlay errors may be generated by process errors. Process errors may include, but are not limited to, errors associated with the fabrication of three-dimensional structures on the sample based on the exposed patterns. For example, process errors may include, but are not limited to, distortions of an exposed pattern during lithography, etch-induced errors, or errors associated with variations in the sample.

It is recognized herein that different sources of error in one layer may impact the overlay of subsequent layers in different ways. For example, grid errors in one layer may result in shifts of the locations of one or more exposure fields on the sample. These grid errors may be partially, and sometimes fully, corrected by adjusting the alignment of the lithography tool in subsequent layers to match the previously-fabricated (erroneous) exposure fields on the sample. In this regard, grid errors of previous layers may be at least partially compensated for in a current layer through feedforward alignment corrections based on alignment targets on one or more previously fabricated layers. Further, drifts in grid errors may be corrected for future samples through appropriate alignment corrections of the lithography tool.

By way of another example, process errors in one layer may introduce distortions of fabricated patterns within each field. It may thus be the case that some process errors may be not be compensated for with feedforward alignment corrections. However, feedforward overlay corrections based on overlay targets located on previously fabricated layers may compensate for and/or mimic the impact of process errors such that the actual overlay errors of the current layer may be limited within selected tolerances. For example, high-order feedforward overlay corrections may induce distortions of exposure fields within a current layer to match the previously-fabricated (erroneous) exposure fields on the sample.

Embodiments of the present disclosure include a process control system suitable for coupling with fabrication tools (e.g., lithography tools, etch tools, or the like) to monitor and adjust the configuration parameters of the fabrication tools to fabricate each layer of a device within selected overlay specifications. Accordingly, a process control system in a fabrication line may generate corrections to previously used control parameters for use in a current fabrication step based on feedback and/or feedforward data associated with grid and/or process errors.

A process control system may accept a variety of sources as inputs for the control of fabrication tools. For example, process control inputs may include historical values of configuration parameters or known systematic biases associated with particular fabrication tools and/or processes. By way of another example, process control inputs may be generated from metrology targets fabricated on one or more layers of a sample to enable characterization of each layer. In this regard, fabrication deviations of metrology targets on a printed layer may be representative of deviations of printed elements on the layer in a given exposure field.

Additional embodiments of the present disclosure are directed to process control using inputs from both alignment targets and overlay targets. Alignment targets may include metrology targets located on one or more fabricated layers of the sample (e.g., alignment reference layers) that are suitable for alignment of the reticle of a lithography tool to the sample for a given exposure field. Accordingly, alignment data may be influenced by and thus be used to compensate for grid errors. Overlay targets may include metrology targets including fabricated features on two or more fabricated layers of the sample. An overlay target may thus be suitable for determining overlay between an overlay reference layer and one or more additional layers. Because overlay targets include fully fabricated features (e.g., features generated through exposure and subsequent etching steps), overlay data may be influenced by and thus at least partially compensate for both grid errors and process-induced errors.

Additional embodiments of the present disclosure are directed to process control for generating fabrication tool configuration parameters (or corrections) for the fabrication of a current layer based on feedback data (e.g., from previous production runs) as well as feedforward data from previous layers, where the feedforward data includes both alignment data and overlay data. For example, feedforward data may include alignment data based on measurements of alignment targets in one or more alignment reference layers and overlay data based on overlay targets in one or more overlay reference layers.

Additional embodiments of the present disclosure are directed to reducing overcorrection associated with the use of both alignment and overlay corrections. It is recognized herein that the use of both feedforward and feedback data by a control system may potentially introduce errors and/or instability. For example, if feedforward data overcorrects for a known variation, the feedback system may not be able to fully compensate. Thus, gains in responsiveness to the known variation may be at the expense of increased steady state noise and instability. By way of another example, if both feedforward data and feedback data relate to a common source of variability, the control system may overcompensate and become unstable and/or noisy.

As described previously herein, alignment data and overlay data may both be influenced by grid errors. Feedforward lithography tool corrections based on both alignment and overlay data may thus overcorrect for grid errors, particularly when reference layers including overlay and alignment targets coincide. In one embodiment, portions of overlay-based feedforward corrections that may also be corrected by the alignment process are removed (e.g., subtracted) from the overlay-based feedforward corrections. In this regard, a process control system may provide the benefits of both alignment and overlay feedforward corrections without undesired crosstalk.

Additional embodiments of the present disclosure are directed to generating layer-to-layer feedforward alignment-based corrections and overlay-based corrections with different models. Metrology targets (e.g., alignment targets and/or overlay targets) may be located in any distribution across a sample and within any number of fields of the sample. Further, alignment targets and overlay targets may be located across the sample with different distributions. For example, feedforward alignment-based corrections may be determined by characterizing alignment targets fabricated on one or more alignment reference layers distributed across the sample and modeling (e.g., extrapolating, interpolating, or the like) alignment-based corrections for each field. Similarly, feedforward overlay-based corrections may be determined by characterizing alignment targets fabricated on one or more overlay reference layers distributed across the sample and modeling (e.g., extrapolating, interpolating, or the like) overlay-based corrections for each field. Further, the models used to determine alignment-based and overlay-based feedforward corrections may be different. For example, the overlay model may include high-order lithography-tool corrections suitable for compensating for process-induced overlay errors. Further, the overlay model may have more degrees of freedom than the alignment model.

Additional embodiments of the present disclosure are directed to process control in which alignment and/or overlay feedforward measurements are based on multiple reference layers. For example, alignment targets suitable for alignment measurements in a first direction (e.g., an X direction) may be located in a first alignment reference layer and alignment targets suitable for alignment measurements in a second direction (e.g., the Y direction) may be located in a second alignment reference layer. Accordingly, alignment-based feedforward corrections may be generated by combining data from the first and second alignment reference layers. Similarly, overlay targets suitable for overlay measurements in a first direction (e.g., an X direction) may be located in a first overlay reference layer and overlay targets suitable for overlay measurements in a second direction (e.g., the Y direction) may be located in a second overlay reference layer. Overlay-based feedforward corrections may thus be generated by combining data from the first and second overlay reference layers. Further, in the case that an alignment reference layer for any direction coincides with an overlay reference layer for the same direction, the alignment corrections may be subtracted from the overlay corrections for that direction to avoid crosstalk.

FIG. 1A is a conceptual view of a semiconductor device fabrication system 100, in accordance with one or more embodiments of the present disclosure. In one embodiment, the system 100 includes a lithography sub-system 102 for lithographically exposing one or more patterns (e.g. device patterns, metrology patterns, or the like) on a sample. The lithography sub-system 102 may include any lithographic tool known in the art. For example, the lithography sub-system 102 may include, but is not limited to, a scanner or stepper. In another embodiment, the system 100 includes a metrology sub-system 104. For example, the metrology sub-system 104 may characterize one or more printed patterns on the sample such as, but not limited to, metrology targets (e.g., alignment and/or overlay targets). By way of another example, the metrology sub-system 104 may characterize a pattern mask (e.g. a reticle including a pattern of device elements to be exposed onto a sample by the lithography sub-system 102). In a general sense, the metrology sub-system 104 may measure any metrology metric (e.g. overlay error, pattern placement error, dimensions of sample features, critical dimensions (CD), sidewall angle, or the like) using any method known in the art. Further, the metrology sub-system 104 may measure metrology metrics based on any technique known in the art. In one embodiment, the metrology sub-system 104 includes an image-based metrology tool to measure metrology data based on the generation of one or more images of the sample (e.g. by directly imaging portions of the sample, by pointwise scanning, or the like). In another embodiment, the metrology sub-system 104 includes a scatterometry-based metrology system to measure metrology data based on the scattering (reflection, diffraction, diffuse scattering, or the like) of light from the sample (e.g. a wafer, a pattern mask, or the like).

In another embodiment, the system 100 includes a controller 106. In another embodiment, the controller 106 includes one or more processors 108 configured to execute program instructions maintained on a memory device 110 (e.g., memory). In this regard, the one or more processors 108 of controller 106 may execute any of the various process steps described throughout the present disclosure. For example, the controller 106 may model alignment and/or overlay data to generate feedforward corrections for controlling the lithography sub-system 102. By way of another example, the controller 106 may subtract alignment-correctable feedforward corrections from overlay data to reduce crosstalk.

The one or more processors 108 of a controller 106 may include any processing element known in the art. In this sense, the one or more processors 108 may include any microprocessor-type device configured to execute algorithms and/or instructions. In one embodiment, the one or more processors 108 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory device 110. Further, the steps described throughout the present disclosure may be carried out by a single controller 106 or, alternatively, multiple controllers. Additionally, the controller 106 may include one or more controllers housed in a common housing or within multiple housings. In this way, any controller or combination of controllers may be separately packaged as a module suitable for integration into system 100. Further, the controller 106 may analyze data received from the detector 142 and feed the data to additional components within the metrology sub-system 104 or external to the system 100.

The memory device 110 may include any storage medium known in the art suitable for storing program instructions executable by the associated one or more processors 108. For example, the memory device 110 may include a non-transitory memory medium. By way of another example, the memory device 110 may include, but is not limited to, a read-only memory, a random access memory, a magnetic or optical memory device (e.g., disk), a magnetic tape, a solid state drive, and the like. It is further noted that memory device 110 may be housed in a common controller housing with the one or more processors 108. In one embodiment, the memory device 110 may be located remotely with respect to the physical location of the one or more processors 108 and controller 106. For instance, the one or more processors 108 of controller 106 may access a remote memory (e.g., server) accessible through a network (e.g., internet, intranet, and the like). Therefore, the above description should not be interpreted as a limitation on the present invention but merely an illustration.

Figure 1B:
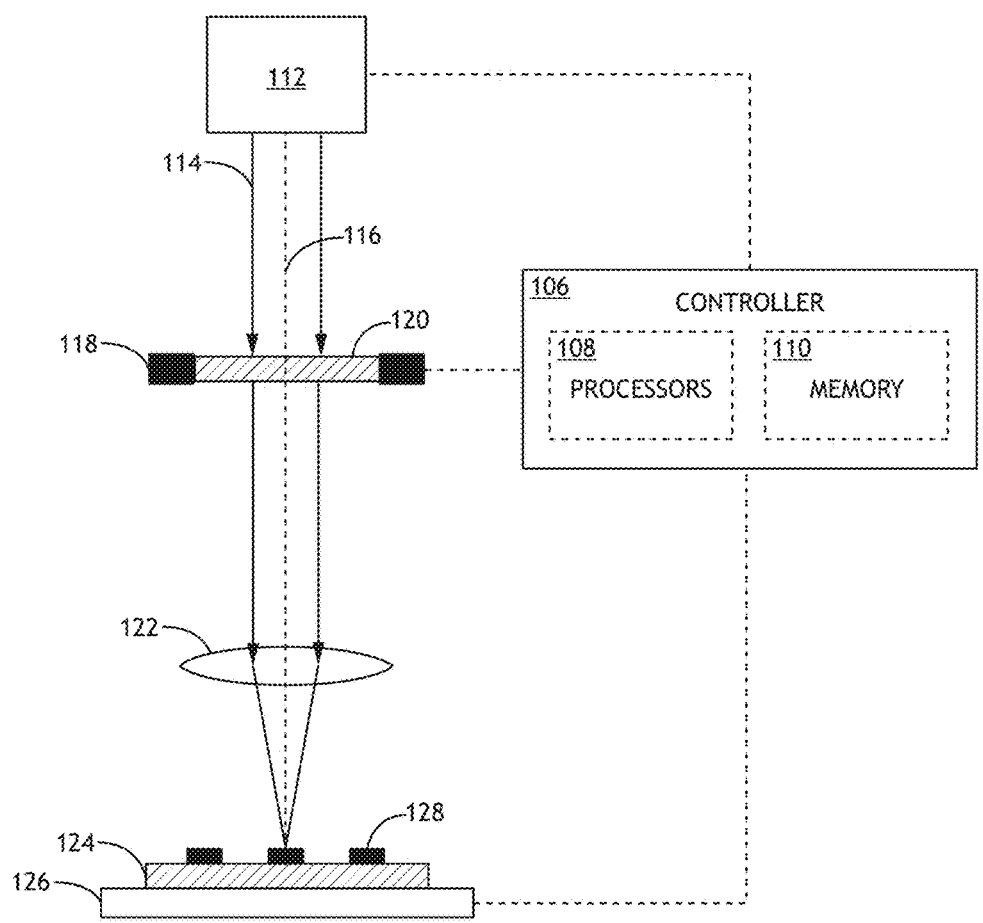
FIG. 1B is a conceptual view of a lithography sub-system, in accordance with one or more embodiments of the present disclosure.

FIG. 1B is a conceptual view of a lithography sub-system 102, in accordance with one or more embodiments of the present disclosure. In one embodiment, the lithography sub-system 102 includes a lithography illumination source 112 configured to generate one or more illumination beams 114. The one or more illumination beams 114 may include one or more selected wavelengths of light including, but not limited to, ultraviolet (UV) radiation, visible radiation, or infrared (IR) radiation.

The lithography illumination source 112 may include any type of illumination source known in the art suitable for generating an illumination beam 114. For example, the lithography illumination source 112 may include one or more laser systems (e.g. gas lasers, diode lasers, free-electron lasers, fiber lasers, disk lasers, or the like). By way of another example, the lithography illumination source 112 may include one or more lamp systems (e.g. arc lamps, or the like). By way of another example, the lithography illumination source 112 includes a plasma illumination source (e.g. a laser-pulsed plasma (LPP) source, a discharge pumped plasma (DPP) source, a laser-sustained plasma (LSP) source, or the like).

The lithography illumination source 112 may additionally include any number of optical elements suitable for manipulating one or more aspects of the illumination beam 114 such as, but not limited to, filters, polarizers, waveplates, or diffusers.

Illumination from the lithography illumination source 112 may have any spatial distribution (e.g. illumination pattern). For example, the lithography illumination source 112 may generate an on-axis illumination beams 114 in which illumination propagates along (or parallel to) an optical axis 116 and/or any number of off-axis illumination beams 114 in which illumination propagates at an angle to the optical axis 116.

In another embodiment, the lithography sub-system 102 includes a mask support device 118. The mask support device 118 is configured to secure a pattern mask 120 (e.g., a reticle) including a pattern of elements to be exposed during fabrication. In another embodiment, the lithography sub-system 102 includes a set of projection optics 122 configured to project an image of the pattern mask 120 illuminated by the one or more illumination beams 114 onto a sample 124 disposed on a sample stage 126 in order to generate printed pattern elements corresponding to the image of the pattern mask 120. In another embodiment, the mask support device 118 may be configured to actuate or position the pattern mask 120. For example, the mask support device 118 may actuate the pattern mask 120 to a selected position with respect to the projection optics 122 of the system 100.

The sample 124 may include any number of photosensitive materials and/or material layers suitable for receiving the image of the pattern mask 120. For example, the sample 124 may include a resist layer 128. In this regard, the set of projection optics 122 may project an image of the pattern mask 120 onto the resist layer 128 to expose the resist layer 128 and a subsequent etching step may remove the exposed material (e.g. positive etching) or the unexposed material (e.g. negative etching) in order to provide printed features on the sample 124.

The controller 106 may be communicatively coupled to any number of elements in the lithography sub-system 102. For example, the controller 106 may be communicatively coupled to the mask support device 118, the lithography illumination source 112, and/or the sample stage 126 to direct the exposure of pattern elements on a pattern mask 120 to a sample 124 (e.g. a resist layer 128 on the sample, or the like). In this regard, exposure conditions such as the exposure dose, the focal position of the sample within the lithography sub-system 102, and the like may be adjusted.

Figure 1C:
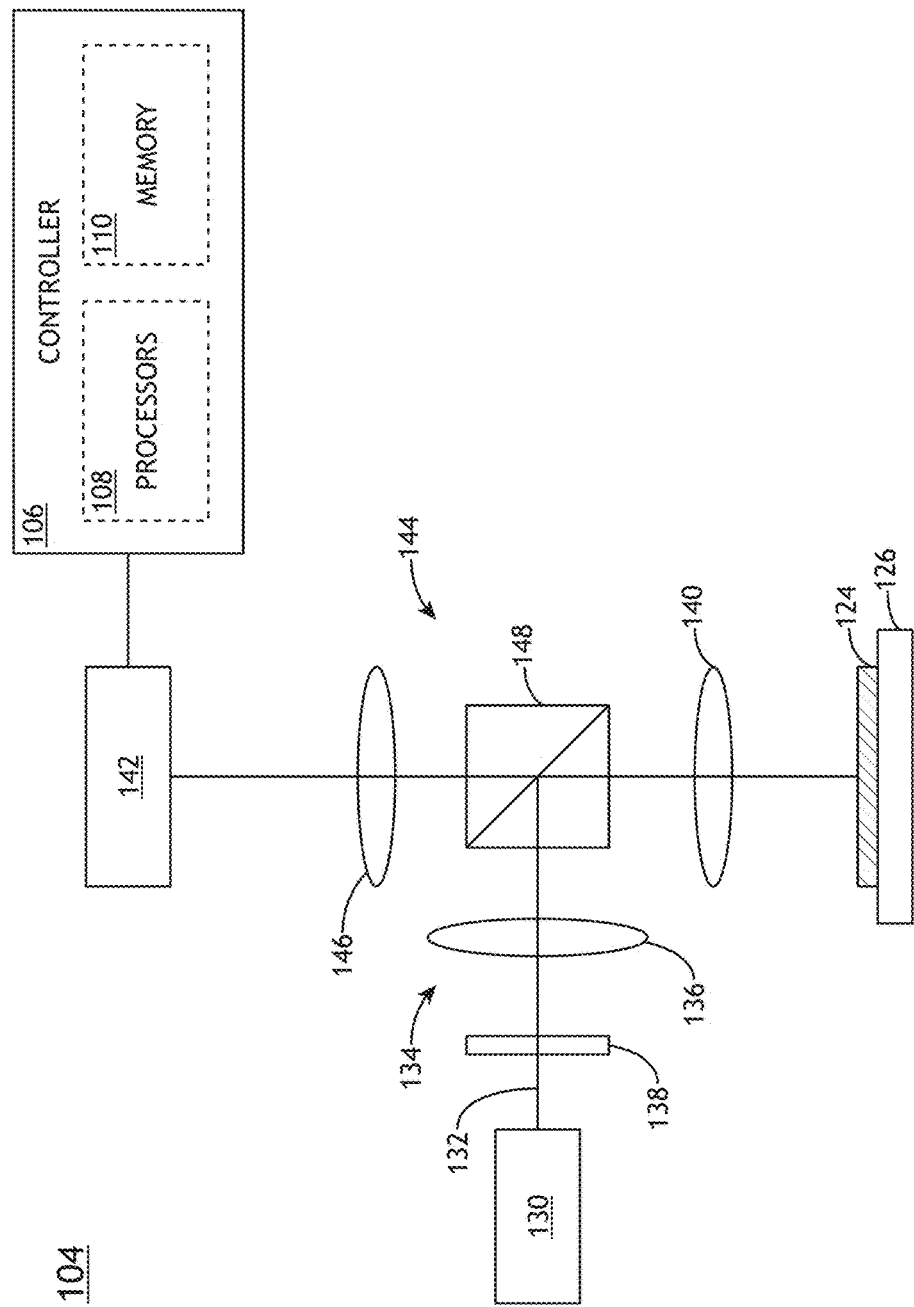
FIG. 1C is a conceptual view of a metrology sub-system, in accordance with one or more embodiments of the present disclosure.

FIG. 1C is a conceptual view of a metrology sub-system 104, in accordance with one or more embodiments of the present disclosure. In one embodiment, the metrology sub-system 104 includes a metrology illumination source 130 to generate a metrology illumination beam 132. In another embodiment, the metrology illumination source 130 is the same as the lithography illumination source 112. In a further embodiment, the metrology illumination source 130 is a separate illumination source configured to generate a separate metrology illumination beam 132. Further, the metrology illumination beam 132 may be any type of illumination beam known in the art suitable for metrology. For example, the metrology illumination beam 132 may include a beam of electromagnetic radiation having or more selected wavelengths including, but not limited to, X-ray wavelengths, ultraviolet (UV) wavelengths, visible wavelengths, or infrared (IR) wavelengths. By way of another example, the metrology illumination beam 132 may include a particle beam such as, but not limited to, an electron beam, an ion beam, or a beam of neutral particles.

In another embodiment, the metrology illumination source 130 directs the metrology illumination beam 132 to the sample 124 via an illumination pathway 134. As used throughout the present disclosure, the term "metrology sample" generally refers to an object to be inspected by the metrology sub-system 104. In this regard, the metrology sub-system 104 may operate as a wafer inspection system.

By way of another example, the sample 124 may include a pattern mask (e.g. reticle). In this regard, the metrology sub-system 104 may operate as a reticle inspection system.

The illumination pathway 134 may include one or more illumination pathway lenses 136 or additional optical components 138 suitable for modifying and/or conditioning the metrology illumination beam 132. For example, the one or more optical components 138 may include, but are not limited to, one or more polarizers, one or more filters, one or more beam splitters, one or more diffusers, one or more homogenizers, one or more apodizers, or one or more beam shapers. In another embodiment, the metrology sub-system 104 includes an objective lens 140 to focus the metrology illumination beam 132 onto the sample 124.

In another embodiment, the metrology sub-system 104 includes a detector 142 configured to capture radiation emanating from the sample 124 through a collection pathway 144. The collection pathway 144 may include one or more collection pathway more collection pathway lenses 146 or additional collection components suitable for capturing and/or modifying the radiation emanating from the sample 124 including, but not limited to one or more lenses, one or more filters, one or more polarizers, or one or more beam blocks.

For example, the detector 142 may receive an image of the sample 124 provided by elements in the collection pathway 144 (e.g. the objective lens 140, collection pathway lenses 146, or the like). By way of another example, a detector 142 may receive radiation reflected or scattered (e.g. via specular reflection, diffuse reflection, and the like) from the sample 124. By way of another example, a detector 142 may receive radiation generated by the sample 124 (e.g. luminescence associated with absorption of the metrology illumination beam 132, or the like). By way of another example, a detector 142 may receive one or more diffracted orders of radiation from the sample 124 (e.g. 0-order diffraction, ±1 order diffraction, ±2 order diffraction, and the like).

The detector 142 may include any type of optical detector known in the art suitable for measuring illumination received from the sample 124. For example, a detector 142 may include, but is not limited to, a CCD detector, a TDI detector, a photomultiplier tube (PMT), an avalanche photodiode (APD), or the like. In another embodiment, a detector 142 may include a spectroscopic detector suitable for identifying wavelengths of radiation emanating from the sample 124. In another embodiment, the metrology sub-system 104 may include multiple detectors 142 (e.g. associated with multiple beam paths generated by one or more beamsplitters to facilitate multiple metrology measurements (e.g. multiple metrology tools) by the metrology sub-system 104.

In one embodiment, as illustrated in FIG. 1C, the metrology sub-system 104 may include a beamsplitter 148 oriented such that the objective lens 140 may simultaneously direct the metrology illumination beam 132 to the sample 124 and collect radiation emanating from the sample 124. In this regard, the metrology sub-system 104 may be configured in an epi-illumination mode. In another embodiment, the angle of incidence of the metrology illumination beam 132 on the sample 124 is adjustable. For example, the path of the metrology illumination beam 132 through the beamsplitter 148 and the objective lens 140 may be adjusted to control the angle of incidence of the metrology illumination beam 132 on the sample 124. In this regard, the metrology illumination beam 132 may have a nominal path through the beamsplitter 126 and the objective lens 140 such that the metrology illumination beam 132 has a normal incidence angle on the sample 124. Further, the angle of incidence of the metrology illumination beam 132 on the sample 124 may be controlled by modifying the position and/or angle of the metrology illumination beam 132 on the beamsplitter 148 (e.g. by rotatable mirrors, a spatial light modulator, a free-form illumination source, or the like). In another embodiment, the metrology illumination source 130 directs the one or more metrology illumination beam 132 to the sample 124 at an angle (e.g. a glancing angle, a 45-degree angle, or the like).

In one embodiment, the controller 106 monitors and adjusts configuration parameters of the lithography sub-system 102 to properly align a current layer being fabricated with one or more previously fabricated layers. In this regard, the controller 106 may provide lithography tool corrections generated to maintain overlay errors within selected tolerances.

As described previously herein, contributors to overlay errors may include, but are not limited to, grid errors or process errors. For example, grid errors may be associated with a misalignment of the FOV of a lithography tool (e.g., lithography sub-system 102) relative to a nominal position on a sample (e.g., sample 124) during exposure of a given field. Grid errors are commonly induced, though are not required to be induced, by positioning errors in a sample stage (e.g., sample stage 126) during translation from one exposure field to the next. By way of another example, process errors may be associated with the fabrication of three-dimensional structures on the sample based on the exposed patterns. In this regard, process errors may include, but are not limited to, distortions of an exposed pattern during lithography, etch-induced errors, or errors associated with variations in the sample.

It is recognized herein that grid errors and process errors in a given layer may impact overlay of subsequent layers differently. Accordingly, process control system 100 may utilize feedback and/or feedforward corrections to provide tight control of overlay errors.

Figure 2:
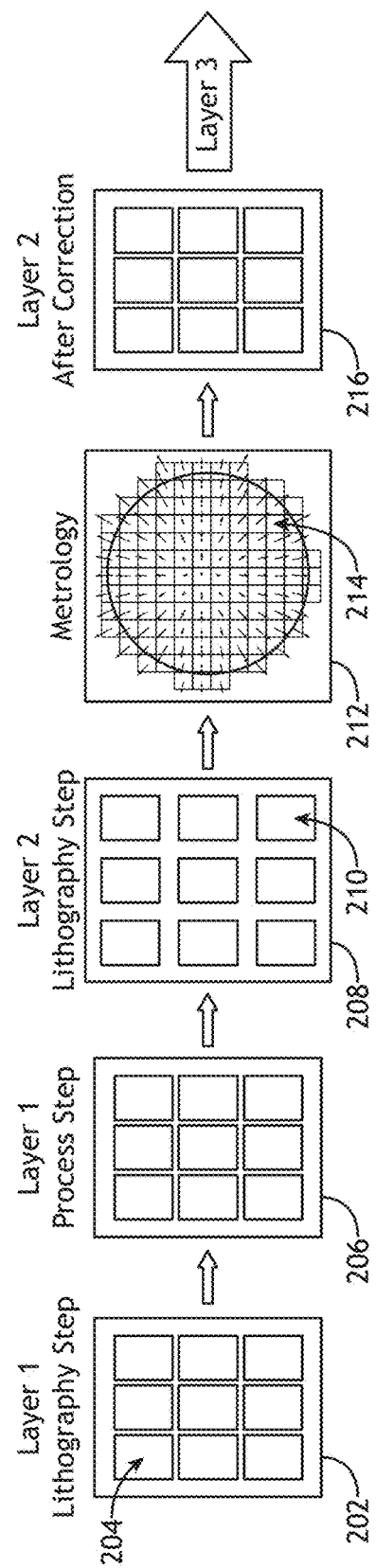
FIG. 2 is a flow diagram illustrating the compensation of grid errors, in accordance with one or more embodiments of the present disclosure.

FIG. 2 is a flow diagram illustrating the compensation of grid errors, in accordance with one or more embodiments of the present disclosure. Specifically, FIG. 2 illustrates a fabrication scenario in which grid errors in a second layer relative to a first layer may be compensated. For example, in a first-layer lithography step 202, a lithography tool may divide a surface of a sample into a plurality of first-layer exposure fields 204 forming a properly aligned exposure grid free of alignment errors. Further, in a first-layer process step 206, patterns within the first-layer exposure fields 204 (not individually shown) are properly fabricated within selected fabrication tolerances. Continuing the example, grid errors in a second-layer lithography step 208 may result in a misalignment of second-layer exposure fields 210 relative to the first-layer exposure fields 204. These grid errors may be characterized and identified in a metrology step 212. Accordingly, a process control system (e.g., system 100) may generate lithography tool corrections as feedback or feedforward data to mitigate the grid errors. For example, as illustrated in FIG. 2, a metrology tool may generate an error field 214 representative of the grid error at various locations across the sample. A process control system may then generate feedback corrections in a second-layer correction step 216 to be applied to subsequent production runs such that the second-layer exposure fields 210 may be aligned to the first-layer exposure fields 204 within selected overlay tolerances. By way of another example, although not shown, a metrology tool may characterize one or more metrology targets fabricated onto the first layer to generate feedforward lithography tool corrections to accurately align the second-layer exposure fields 210 to the first-layer exposure fields 204.

Figure 3:
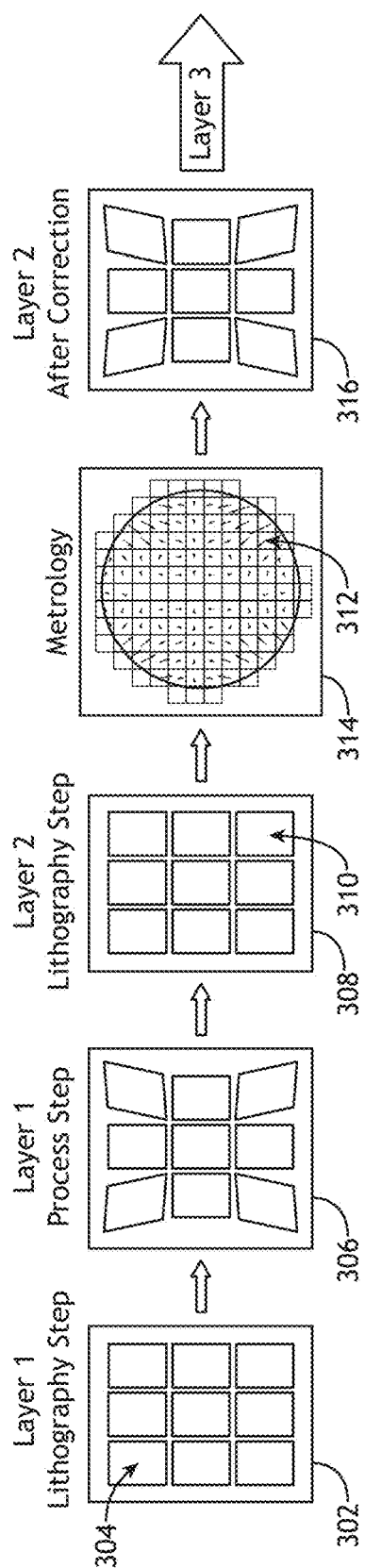
FIG. 3 is a flow diagram illustrating the compensation of process errors, in accordance with one or more embodiments of the present disclosure.

FIG. 3 is a flow diagram illustrating the compensation of process errors, in accordance with one or more embodiments of the present disclosure. Specifically, FIG. 3 illustrates a fabrication scenario in which process errors in a first layer may be compensated in subsequent layers. For example, in a first-layer lithography step 302, a lithography tool may divide a surface of a sample into a plurality of first-layer exposure fields 304 forming a properly aligned exposure grid free of alignment errors. However, in this example, a first-layer process step 306 may generate process errors that distort the exposure grid. Accordingly, a second-layer exposure grid 308 generated in a second-layer lithography step 310 may not properly overlap with the first-layer exposure fields 304. A metrology tool may then generate an error field 312 in a metrology step 314 that may be used to generate feedback corrections to be applied to subsequent production runs. In this regard, the corrections may distort the second-layer exposure grid 308 in a second-layer correction step 316 to match the first-layer exposure fields 304 and limit overlay errors to the selected tolerances. By way of another example, although not shown, a metrology tool may characterize one or more metrology targets fabricated onto the first layer to generate feedforward lithography tool corrections to accurately align (e.g., distort) the second-layer exposure grid 308 to the first-layer exposure fields 304.

In another embodiment, the process control system 100 generates lithography tool configuration parameters (or corrections) for the fabrication of a current layer based on both feedback and feedforward data to maintain overlay errors within selected tolerances.

For example, the system 100 may utilize feedforward data to correct for known variations (e.g., measured grid and/or process errors) in previous layers that may impact the proper exposure conditions for the current layer. For example, feedforward data may compensate for systematic biases associated with particular fabrication tools and/or fabrication processes such as, but not limited to, etch bias, reticle misregistration, or scanner matching. By way of another example, feedforward data may compensate for known process variations such as, but not limited to, known process variations at the edges of wafer relative to the centers of wafers. By way of a further example, feedforward data may compensate for measured variations in previously-fabricated layers of a sample. In this regard, lithography and/or etch processes of a current layer may be adjusted based on the actual characteristics of previous layers, which may result in low overlay errors and corresponding high device performance.

By way of another example, the system 100 may utilize feedback data to correct for gradual drifts in the fabrication of a current layer. For instance, gradual deviations of fabrication processes may lead to grid and/or process errors that manifest as overlay errors as well as variations in film thickness, critical dimensions, sidewall angles, chemical properties, electrical properties, optical properties, or the like. The system 100 may provide metrology measurements of relevant characteristics on fabricated samples at various stages in the fabrication process to a process control system to generate feedback data. This feedback data may be provided at any frequency to provide lithography tool corrections (e.g., corrections for the lithography sub-system 102) for the fabrication of the current layer on a die-by-die basis on a single sample, on a sample-by-sample basis, on a lot-by-lot basis, or the like.

Feedback data may additionally compensate for errors introduced by feedforward data. However, it is recognized herein that the use of both feedforward and feedback data as corrections to a process control system (e.g., system 100) may potentially introduce errors and/or instability. For example, if feedforward data overcorrects for a known variation, the feedback system may not be able to fully compensate. Thus, gains in responsiveness to the known variation may be at the expense of increased steady state noise and instability. By way of another example, if both feedforward data and feedback data relate to a common source of variability, the control system may overcompensate and become unstable and/or noisy.

Figure 4A:
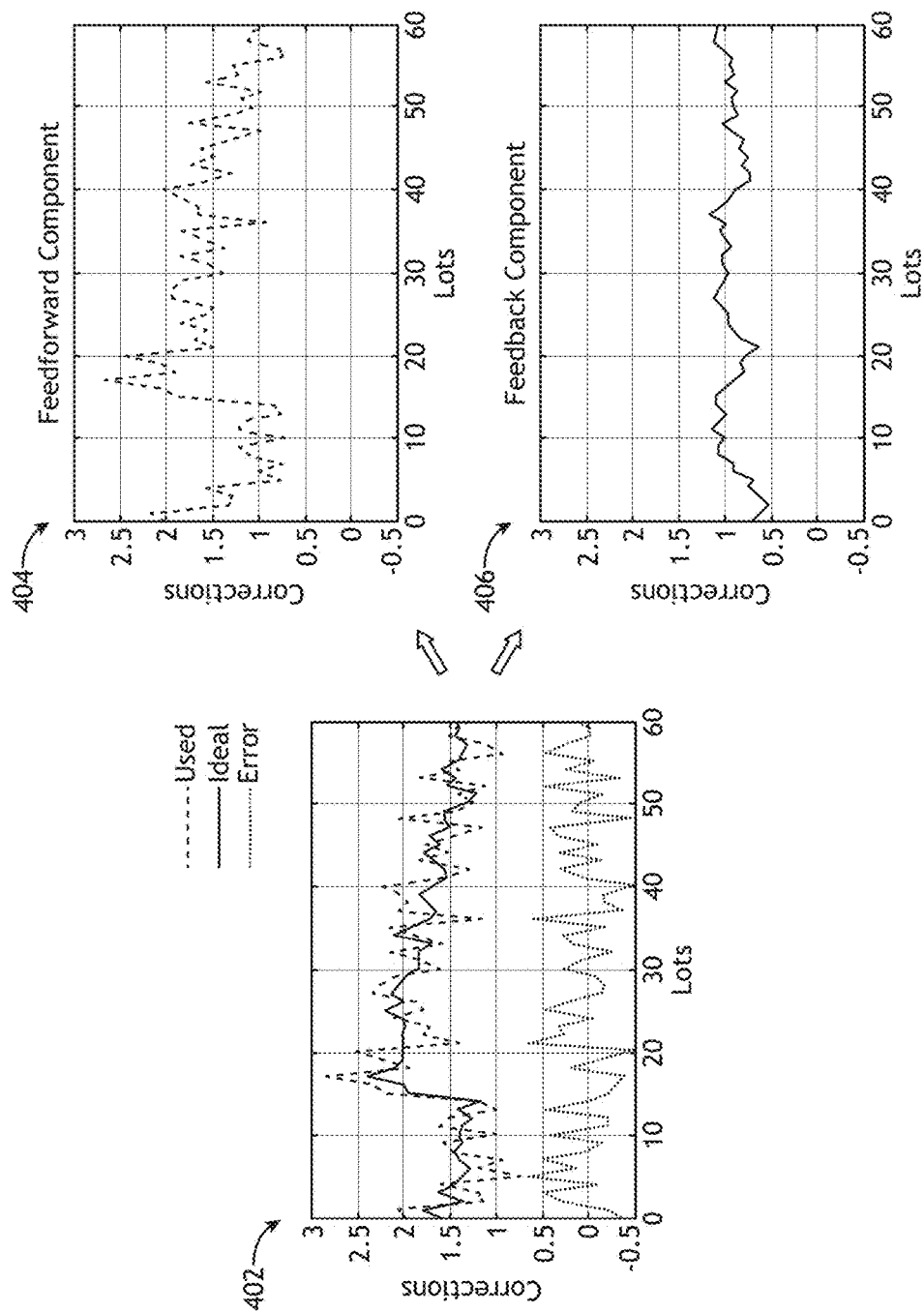
FIG. 4A is a series of plots illustrating process control with problematic feedback and feedforward corrections exhibiting overcorrection to incoming variations, in accordance with one or more embodiments of the present disclosure.
Figure 4B:
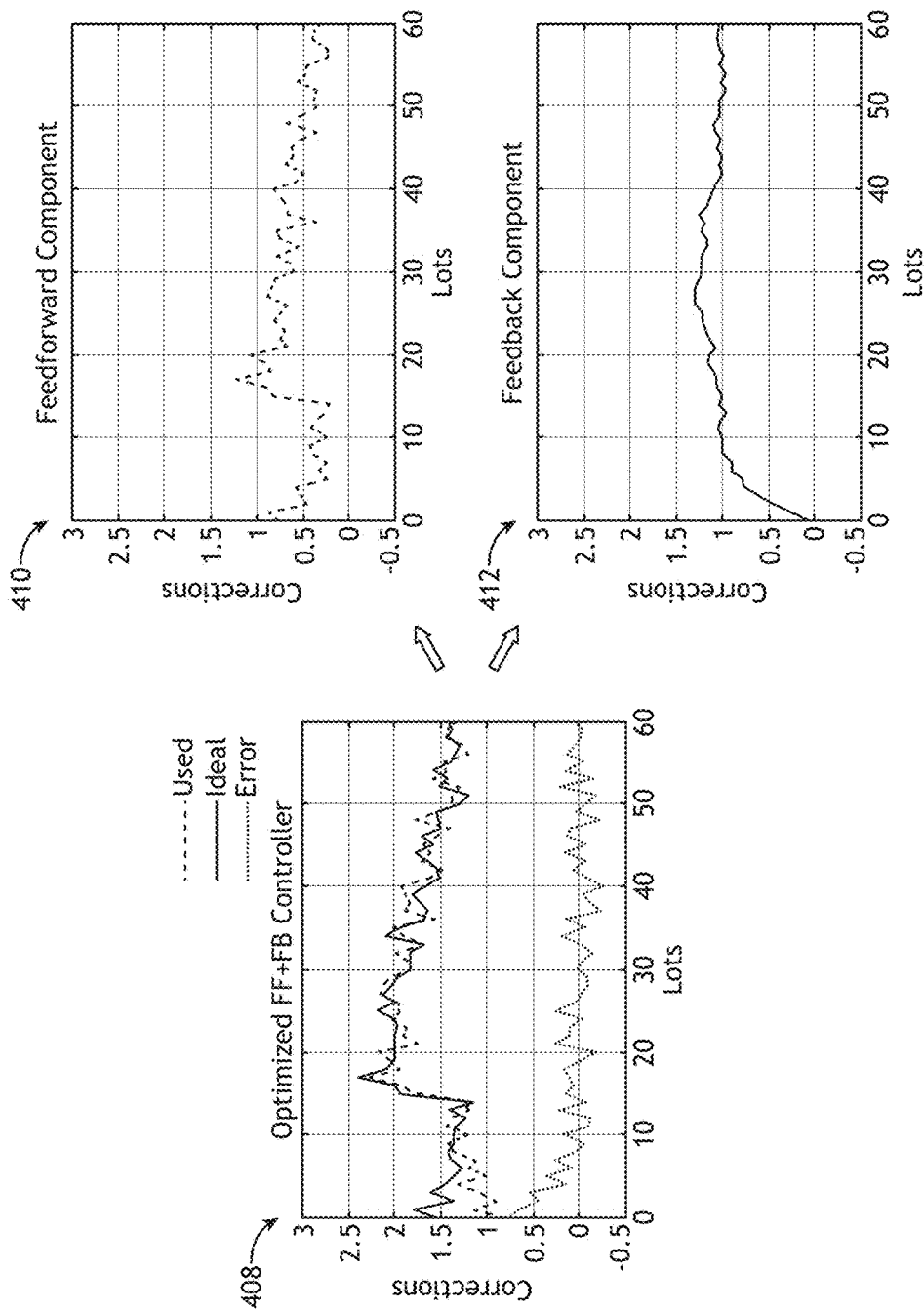
FIG. 4B is a series of plots illustrating process control with feedback and feedforward corrections designed to reduce overcorrection, in accordance with one or more embodiments of the present disclosure.

FIGS. 4A and 4B illustrate the responsiveness of process control with different combinations of feedback and feedforward corrections to a variation between lots 14 and 15 of a 61-lot production run.

FIG. 4A is a series of plots illustrating process control with problematic feedback and feedforward corrections exhibiting overcorrection to incoming variations, in accordance with one or more embodiments of the present disclosure. Plot 402 includes graphs of used and ideal corrections as well as error values for the 61-lot production run. Further, plot 404 includes a graph of a feedforward component of the corrections of plot 402, while plot 406 includes a graph of the feedback component of the corrections of plot 402. The feedforward corrections do provide rapid compensation for the variation between lots 14 and 15, but the overcompensation introduces noise. Further, the feedback corrections cannot fully compensate for the errors introduced by the feedforward control. As a result, the process controller provides responsiveness to measurable incoming variations at the cost of steady state noise.

FIG. 4B is a series of plots illustrating process control with feedback and feedforward corrections designed to reduce overcorrection, in accordance with one or more embodiments of the present disclosure. Plot 408 includes graphs of used and ideal corrections as well as error values for the 61-lot production run. Further, plot 410 includes a graph of a feedforward component of the corrections of plot 408, while plot 412 includes a graph of the feedback component of the corrections of plot 408. By reducing the overcorrection, the feedback and feedforward corrections may provide both responsive and stable control. For example, the feedforward corrections may compensate for known incoming variations (e.g., step changes, or the like) and the feedback corrections may compensate for gradual drifts in the fabrication process and bias induced by the feedforward corrections.

In another embodiment, the system 100 provides feedforward corrections based on both alignment and overlay data from previously fabricated layers. For example, alignment data and overlay data may be based on metrology measurements of alignment and overlay targets, respectively. In this regard the feedforward corrections may account for multiple error sources such as, but not limited to, grid errors and process errors. Further, the system 100 may reduce overcorrection associated with variations commonly measured by both alignment and overlay targets such as, but not limited to, grid errors. For example, the system 100 may generate overlay-based feedforward corrections, determine which components of the overlay-based feedforward corrections may also be compensated for through feedforward alignment corrections, and remove the common components. In this regard, the overlay-based feedforward corrections and the alignment-based feedforward corrections may be independent.

Figure 5:
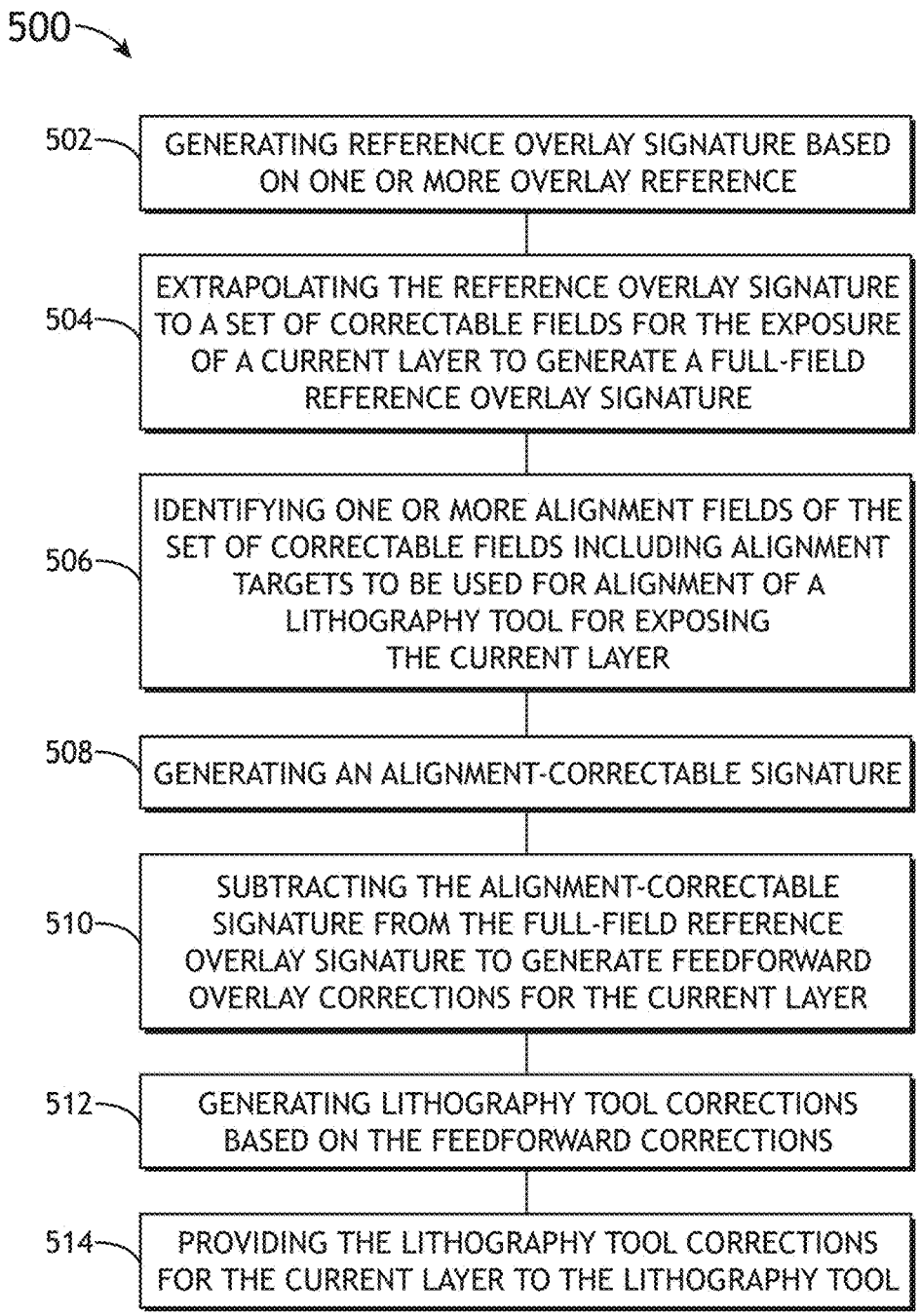
FIG. 5 is a flow diagram illustrating steps performed in a process control method for generating independent feedforward corrections based on both alignment and overlay measurements, in accordance with one or more embodiments of the present disclosure.

FIG. 5 is a flow diagram illustrating steps performed in a process control method 500 for generating independent feedforward corrections based on both alignment and overlay measurements, in accordance with one or more embodiments of the present disclosure. Applicant notes that the embodiments and enabling technologies described previously herein in the context of system 100 should be interpreted to extend to method 500. It is further noted, however, that the method 500 is not limited to the architecture of system 100.

In one embodiment, the method 500 includes a step 502 of generating reference overlay signature based on one or more overlay reference layers of a sample using overlay models for the one or more reference layers.

For example, the step 502 may include identifying one or more previously-fabricated layers to serve as overlay reference layers for the generation of feedforward corrections for a current layer. Further, the step 502 may include receiving the set of overlay corrections that were applied during the fabrication of the overlay reference layers. For example, the set of overlay corrections applied to the overlay reference layers may be stored on and received from a nonvolatile storage device (e.g., a server, a process control system, or the like). In this regard, the reference overlay signature may include overlay corrections applied to the overlay reference layers as an initial estimate for feedforward corrections to be applied to the current layer.

In another embodiment, the method 500 includes a step 504 of extrapolating the reference overlay signature to a set of correctable fields for the exposure of a current layer of the sample to generate a full-field reference overlay signature. The step 504 may thus include generating overlay estimate data for all of the correctable fields in the current layer.

It may be the case that different layers of a sample may be exposed using different exposure grids. For example, a lithography tool used to expose multiple layers of a sample may divide the sample into a different exposure grid for each exposure step. For example, the size, orientation, and/or distribution of exposure fields may be customized for each exposure step based on the size, orientation, and or distribution of the device elements being fabricated. By way of another example, different lithography tools may be utilized to expose different layers of the sample. In this regard, each layer of a sample may be fabricated with a lithography tool well-suited for the particular patterns to be fabricated for that layer.

In another embodiment, the method 500 includes a step 506 of identifying one or more alignment fields of the set of correctable fields including alignment targets to be used for alignment of a lithography tool for exposing the current layer. The alignment targets may be distributed on the sample in any pattern suitable for aligning a lithography tool. Accordingly, step 506 may include determining the locations of alignment targets to be utilized to align the current layer and further identifying which fields of the set of correctable fields contain the alignment targets.

In another embodiment, the method 500 includes a step 508 of generating an alignment-correctable signature. For example, the alignment-correctable signature may be generated by modeling alignment corrections for the set of correctable fields based on data from the full-field reference overlay signature in the one or more alignment fields using an alignment model for the current layer. In this regard, the alignment-correctable signature may include the components of the full-field reference overlay signature of step 504 that may be compensated for by feedforward alignment corrections based on the alignment targets. Accordingly, the alignment-correctable signature may represent data that may result in overcorrections and instability when both overlay and alignment data are provided as feedforward data.

In another embodiment, the method 500 includes a step 510 of subtracting the alignment-correctable signature from the full-field reference overlay signature to generate feedforward overlay corrections for the current layer when the one or more overlay reference layers are the same as the one or more alignment reference layers.

It is recognized herein that the use of both alignment and overlay feedforward data may result in overcorrection when the alignment and overlay reference layers are the same and may result in little or possibly no overcorrection when the alignment and overlay reference layers are different. Accordingly, the step 510 may be, but is not required to be, omitted when the alignment and overlay reference layers are different.

Figure 6:
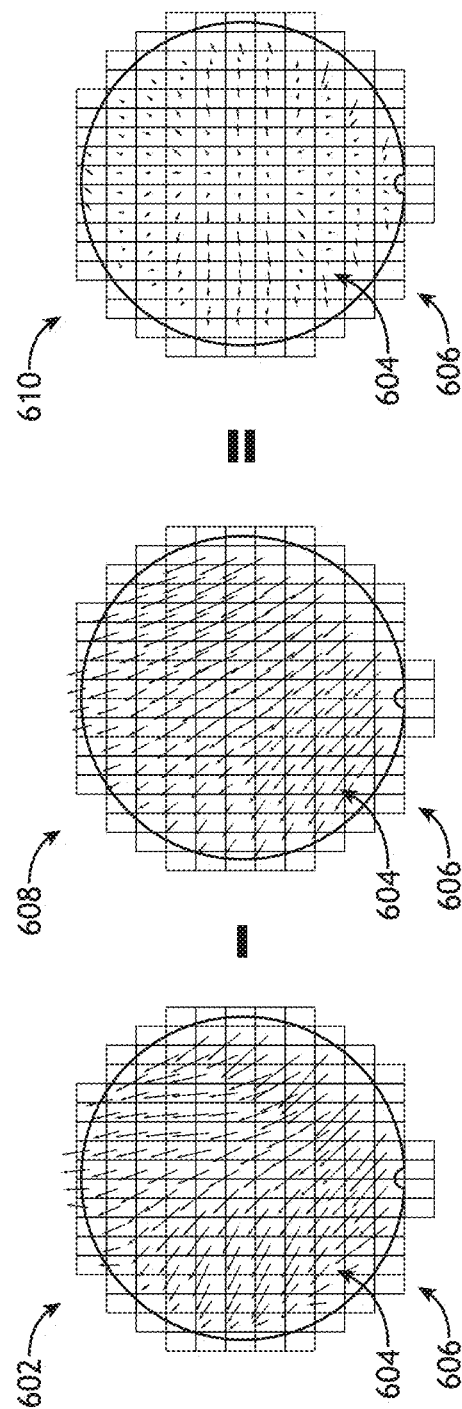
FIG. 6 is a series of vector fields illustrating the subtraction of the alignment-correctable signature from the full-field reference overlay signature, in accordance with one or more embodiments of the present disclosure.

FIG. 6 is a series of vector fields illustrating the subtraction of the alignment-correctable signature from the full-field reference overlay signature, in accordance with one or more embodiments of the present disclosure. In one embodiment, a full-field reference overlay signature 602 for a current layer being fabricated may include a vector representing a magnitude and direction of overlay error for each exposure field 604 in the set of correctable fields 606 for the current layer on a sample 124. The overlay vectors for each exposure field 604 may be generated in step 504 by extrapolating the overlay corrections used to expose the overlay reference layers to the set of correctable fields 606 based on the overlay models for the overlay reference layers.

Further, the alignment-correctable signature 608 generated in step 508 may similarly include a vector representing a magnitude and direction of alignment-correctable data for each exposure field 604 in the set of correctable fields 606. Accordingly, the feedforward overlay corrections 610 for the current layer may be generated by subtracting the alignment-correctable signature 608 from the full-field reference overlay signature 602 (e.g., via point by point subtraction of each exposure field 604) as illustrated in FIG. 6.

The full-field reference overlay signature (e.g., full-field reference overlay signature 602) may include linear correction terms and higher-order terms. The linear correction terms may be used to compensate for linear errors such as, but not limited to, grid errors, while the higher-order terms may be used to compensate for process errors. It may thus be the case that alignment-based feedforward corrections may compensate for a portion of the linear terms. Accordingly, step 510 may include subtracting the portion of the linear terms that are correctable using alignment data to avoid overcorrection.

The full-field reference overlay signature 602 and/or the alignment-correctable signature 608 may be generated from any number of overlay or alignment reference layers. For example, feedforward overlay corrections along a first direction (e.g., an X direction) may be generated from a first overlay reference layer and feedforward overlay corrections along a second direction (e.g., a Y direction) may be generated from a second overlay reference layer. Similarly, feedforward alignment corrections along a first direction (e.g., an X direction) may be generated from a first alignment reference layer and feedforward alignment corrections along a second direction (e.g., a Y direction) may be generated from a second alignment reference layer.

Figure 7:
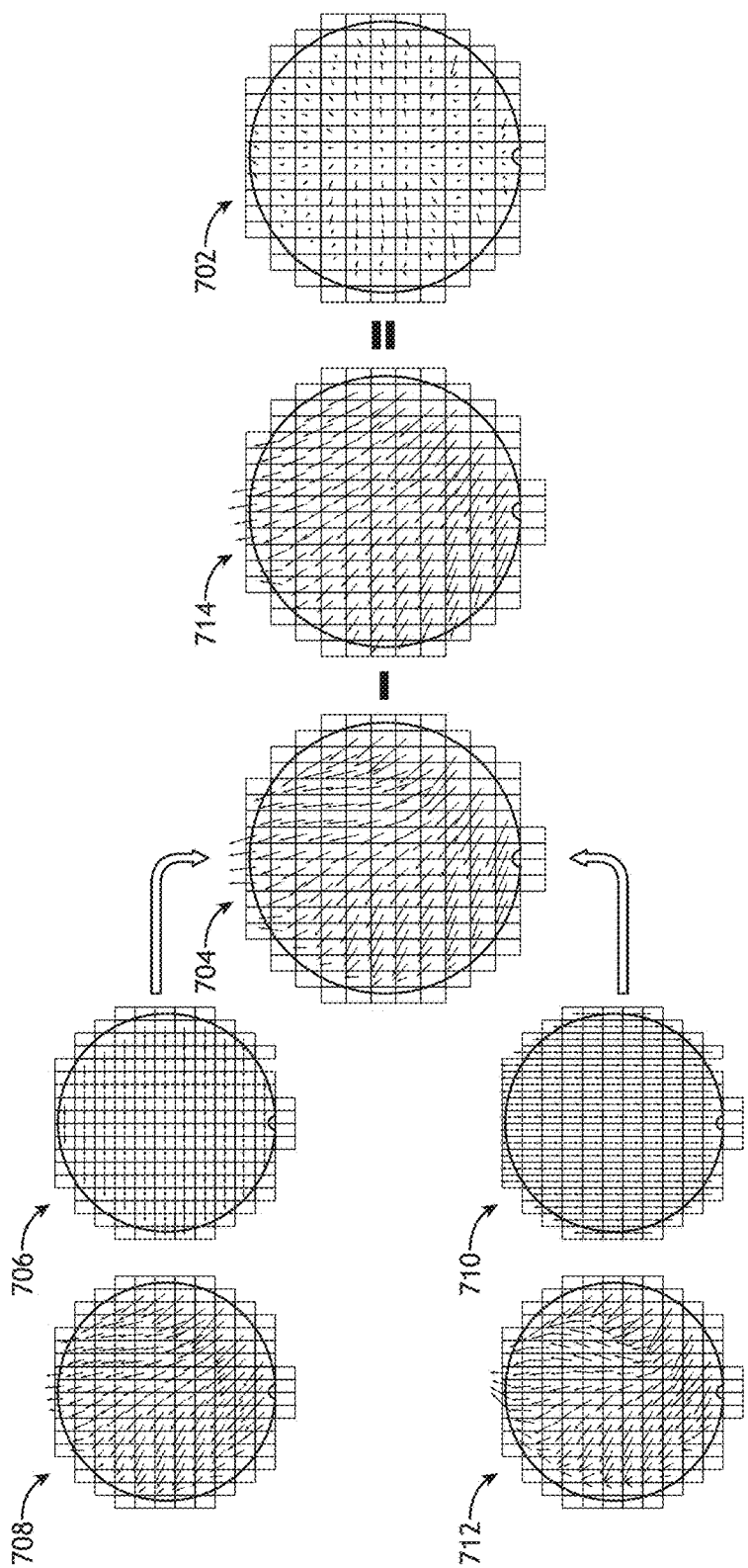
FIG. 7 is a series of vector fields illustrating the generation of feedforward overlay corrections based on two overlay reference layers and a single alignment reference layer, in accordance with one or more embodiments of the present disclosure.

FIG. 7 is a series of vector fields illustrating the generation of feedforward overlay corrections 702 based on two overlay reference layers and a single alignment reference layer, in accordance with one or more embodiments of the present disclosure. In one embodiment, a full-field reference overlay signature 704 is generated by combining the X-components 706 of a first layer reference overlay signature 708 and the Y-components 710 of a second layer reference overlay signature 712 into a single vector field. Accordingly, the feedforward overlay corrections 702 may be generated by subtracting the alignment-correctable signature 714 from the combined full-field reference overlay signature 704.

In another embodiment, an alignment-correctable signature may be similarly generated by combining the X-components of a first layer alignment-correctable signature and the Y-components of a second layer alignment-correctable signature into a single vector field.

It may be the case that alignment and overlay reference layers may coincide for one direction, multiple directions, or for no directions. Accordingly, the method 500 may include determining whether overlay reference layers and alignment reference layers coincide for each measurement direction and subtracting the portions of the alignment-correctable signature 608 from the full-field reference overlay signature 602 from coinciding reference layers.

For example, if an overlay reference layer providing X-direction feedforward overlay data coincides with an alignment reference layer providing X-direction feedforward alignment data, step 510 may include generating X-components of the feedforward overlay corrections by subtracting X-components of alignment-correctable signature from the X-components of the full-field reference overlay signature. Similarly, if an overlay reference layer providing Y-direction feedforward overlay data coincides with an alignment reference layer providing Y-direction feedforward alignment data, step 510 may include generating Y-components of the feedforward overlay corrections by subtracting Y-components of alignment-correctable signature from the X-components of the full-field reference overlay signature.

In another embodiment, the method 500 includes a step 512 of generating lithography tool corrections based on the feedforward corrections. For example, step 512 may include generating lithography tool corrections based on the feedforward overlay corrections as well as feedback corrections to compensate for drifts of fabrication tools during the fabrication of the current layer. In this regard, step 512 may include integrating the feedforward corrections and feedback corrections into a single set of corrections suitable for configuring a lithography tool for the fabrication of the current layer in one or more fabrication runs. In one instance, the process controller may utilize, but is not required to utilize an exponential weighted moving average (EWMA) technique to integrate historical lithography tool corrections with feedback data generated in step 510 to provide a single set of correctables. Further, the lithography tool corrections may include feedforward alignment corrections based on measurement of alignment metrology targets on the alignment reference layers. In this regard, the lithography tool corrections may include independent feedforward and feedback corrections with reduced overcorrections that may maintain overlay errors within selected tolerances.

In another embodiment, the method 500 includes a step 514 of providing the lithography tool corrections for the current layer to the lithography tool. For example, a process controller (e.g., system 100) implementing the method 500 may transmit the lithography tool corrections generated in step 512 to the lithography tool such that the lithography tool may accurately expose the current layer in one or more fabrication runs.

It is to be understood, however, that the method 500 may be performed by any component of a fabrication line. Further, the steps of method 500 may be performed via a single hardware element (e.g., a single controller) or via multiple hardware elements (e.g., by multiple controllers). For example, one or more steps of method 500 may be performed by fabrication tools such as, but not limited to, lithography tools (e.g., lithography sub-system 102) or metrology tools (e.g., metrology sub-system 104). In one embodiment, one or more steps of method 500 are performed by the lithography tool to be used for the fabrication of the current layer. For example, at least the step 512 may be carried out on a controller integrated within and/or forming a part of the lithography tool such that the lithography tool corrections of step 512 such that step 514 may be optional.

In another embodiment, the method 500 may include a step of remodeling the feedforward overlay based on an alignment model for the current layer prior to generating the lithography tool corrections in step 512. For example, a process control system may utilize different overlay models (e.g., with different orders of corrections, different weights, or the like) for different layers of a device. In this regard, the feedforward overlay corrections from step 510 that are based on an overlay model for the overlay reference layers may be remodeled with an overlay model for the current layer to improve system performance. By way of another example, a fabrication line may utilize different lithography tools for exposing different layers of a device. Accordingly, the feedforward overlay corrections from step 510 may be remodeled to accommodate the particular lithography tool selected to expose the current layer.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include, but are not limited to, physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A process control system, comprising:
a controller including one or more processors, the one or more processors configured to execute program instructions configured to cause the one or more processors to:
generate a reference overlay signature based on one or more overlay reference layers of a sample using overlay models for the one or more overlay reference layers;
extrapolate the reference overlay signature to a set of correctable fields for the exposure of a current layer of the sample to generate a full-field reference overlay signature;
identify one or more alignment fields of the set of correctable fields including alignment targets to be used for alignment of a lithography tool for exposing the current layer, wherein the alignment targets are located in one or more alignment reference layers of the sample;
generate an alignment-correctable signature by modeling alignment corrections for the set of correctable fields based on data from the full-field reference overlay signature in the one or more alignment fields using an alignment model for the current layer;
subtract the alignment-correctable signature from the full-field reference overlay signature to generate feedforward overlay corrections for the current layer when the one or more overlay reference layers are the same as the one or more alignment reference layers;
generate lithography tool corrections based on the feedforward overlay corrections; and
provide the lithography tool corrections for the current layer to the lithography tool.

2. The process control system of claim 1, wherein the one or more processors are further configured to execute program instructions causing the one or more processors to:
prior to providing the lithography tool corrections for the current layer to the lithography tool, remodel the feedforward overlay corrections with an overlay model for the current layer.

3. The process control system of claim 2, wherein the overlay model for the current layer includes more degrees of freedom than the alignment model for the current layer.

4. The process control system of claim 2, wherein the lithography tool for exposing the current layer is different than a lithography tool for exposing at least one of the one or more alignment reference layers or the one or more overlay reference layers.

5. The process control system of claim 1, wherein the one or more overlay reference layers include a first overlay reference layer for overlay measurements in a first direction, wherein the one or more overlay reference layers further include a second overlay reference layer for overlay measurements in a second direction.

6. The process control system of claim 5, wherein the first overlay reference layer is different than the second overlay reference layer.

7. The process control system of claim 5, wherein the first direction is different than the second direction.

8. The process control system of claim 5, wherein the first direction is orthogonal to the second direction.

9. The process control system of claim 5, wherein extrapolate the reference overlay signature to a set of correctable fields for the exposure of a current layer of the sample comprises:
extrapolating the first set of overlay corrections to the set of correctable fields to generate a component of the full-field reference overlay signature along the first direction; and
extrapolating the second set of overlay corrections to the set of correctable fields to generate a component of the full-field reference overlay signature along the second direction.

10. The process control system of claim 5, wherein the one or more alignment reference layers include a first alignment reference layer for correcting alignment of the lithography tool along the first direction, wherein the one or more alignment reference layers include a second alignment reference layer for correcting alignment of the lithography tool along the second direction.

11. The process control system of claim 10, wherein the first overlay reference layer is the same as the first alignment reference layer, wherein subtracting the alignment-correctable signature from the full-field reference overlay signature comprises:
subtracting a first direction component of the alignment-correctable signature from a first direction component of the full-field reference overlay signature to generate a first direction component of the feedforward overlay corrections.

12. The process control system of claim 10, wherein the second overlay reference layer is the same as the second alignment reference layer, wherein subtracting the alignment-correctable signature from the full-field reference overlay signature comprises:
subtracting a second direction component of the alignment-correctable signature from a second direction component of the full-field reference overlay signature to generate a second direction component of the feedforward overlay corrections.

13. The process control system of claim 1, wherein the one or more alignment reference layers include a first alignment reference layer for correcting alignment of the lithography tool along a first direction, wherein the one or more alignment reference layers include a second alignment reference layer for correcting alignment of the lithography tool along a second direction.

14. The process control system of claim 13, wherein the first alignment reference layer is different than the second alignment reference layer.

15. The process control system of claim 13, wherein the first direction is different than the second direction.

16. The process control system of claim 13, wherein the first direction is orthogonal to the second direction.

17. The process control system of claim 1, wherein subtracting the alignment-correctable signature from the full-field reference overlay signature to generate feedforward overlay corrections for the current layer comprises point-by-point subtraction for each field of the set of correctable fields.

18. The process control system of claim 1, wherein generating the lithography tool corrections based on the feedforward overlay corrections comprises:
generating the lithography tool corrections based on the feedforward overlay corrections and feedback overlay corrections for the current layer.

19. The process control system of claim 1, wherein the lithography tool is a scanner lithography tool.

20. The process control system of claim 1, wherein the lithography tool is a stepper lithography tool.

21. The control system of claim 13, wherein the first alignment reference layer is different than the second alignment reference layer.

22. The control system of claim 13, wherein the first direction is different than the second direction.

23. A system, comprising:
a controller configured to be coupled to a process control system, the controller including one or more processors configured to execute program instructions configured to cause the one or more processors to:
generate a reference overlay signature based on one or more overlay reference layers of a sample using overlay models for the one or more overlay reference layers;
extrapolate the reference overlay signature to a set of correctable fields for the exposure of a current layer of the sample to generate a full-field reference overlay signature;
identify one or more alignment fields of the set of correctable fields including alignment targets to be used for alignment of a lithography tool for exposing the current layer, wherein the alignment targets are located in one or more alignment reference layers of the sample;
generate an alignment-correctable signature by modeling alignment corrections for the set of correctable fields based on data from the full-field reference overlay signature in the one or more alignment fields using an alignment model for the current layer;
subtract the alignment-correctable signature from the full-field reference overlay signature to generate feedforward overlay corrections for the current layer when the one or more overlay reference layers are the same as the one or more alignment reference layers;
generate lithography tool corrections based on the feedforward overlay corrections; and
provide the lithography tool corrections to the process control system for adjusting the lithography tool for exposing the current layer.

24. The system of claim 23, wherein the one or more processors are further configured to execute program instructions causing the one or more processors to:
prior to providing the lithography tool corrections for the current layer to the lithography tool, remodel the feedforward overlay corrections with an overlay model for the current layer.

25. The control system of claim 24, wherein the overlay model for the current layer includes more degrees of freedom than the alignment model for the current layer.

26. The control system of claim 24, wherein the lithography tool for exposing the current layer is different than a lithography tool for exposing at least one of the one or more alignment reference layers or the one or more overlay reference layers.

27. The system of claim 23, wherein the one or more overlay reference layers include a first overlay reference layer for overlay measurements in a first direction, wherein the one or more overlay reference layers further include a second reference layer for overlay measurements in a second direction.

28. The control system of claim 27, wherein the first overlay reference layer is different than the second overlay reference layer.

29. The control system of claim 27, wherein the first direction is different than the second direction.

30. The system of claim 27, wherein extrapolate the reference overlay signature to a set of correctable fields for the exposure of a current layer of the sample comprises:
extrapolating the first set of overlay corrections to the set of correctable fields to generate a component of the full-field reference overlay signature along the first direction; and
extrapolating the second set of overlay corrections to the set of correctable fields to generate a component of the full-field reference overlay signature along the second direction.

31. The control system of claim 27, wherein the one or more alignment reference layers include a first alignment reference layer for correcting alignment of the lithography tool along the first direction, wherein the one or more alignment reference layers include a second alignment reference layer for correcting alignment of the lithography tool along the second direction.

32. The system of claim 31, wherein the first overlay reference layer is the same as the first alignment reference layer, wherein subtracting the alignment-correctable signature from the full-field reference overlay signature comprises:
subtracting a first direction component of the alignment-correctable signature from a first direction component of the full-field reference overlay signature to generate a first direction component of the feedforward overlay corrections.

33. The control system of claim 31, wherein the second overlay reference layer is the same as the second alignment reference layer, wherein subtracting the alignment-correctable signature from the full-field reference overlay signature comprises:
subtracting a second direction component of the alignment-correctable signature from a second direction component of the full-field reference overlay signature to generate a second direction component of the feedforward overlay corrections.

34. The system of claim 23, wherein the one or more alignment reference layers include a first alignment reference layer for correcting alignment of the lithography tool along a first direction, wherein the one or more alignment reference layers include a second alignment reference layer for correcting alignment of the lithography tool along a second direction.

35. The control system of claim 23, wherein subtracting the alignment-correctable signature from the full-fiel reference overlay signature to generate feedforward overlay corrections for the current layer comprises point-by-point subtraction for each field of the set of correctable fields.

36. The system of claim 23, wherein generating the lithography tool corrections based on the feedforward overlay corrections comprises:
generating the lithography tool corrections based on the feedforward overlay corrections and feedback overlay corrections for the current layer.

37. A process control system, comprising:
a lithography tool; and
a controller communicatively coupled to the lithography tool, the controller including one or more processors configured to execute program instructions configured to cause the one or more processors to:
generate a reference overlay signature based on one or more overlay reference layers of a sample using overlay models for the one or more overlay reference layers;

extrapolate the reference overlay signature to a set of correctable fields for the exposure of a current layer of the sample to generate a full-field reference overlay signature;

identify one or more alignment fields of the set of correctable fields including alignment targets to be used for alignment of a lithography tool for exposing the current layer, wherein the alignment targets are located in one or more alignment reference layers of the sample;

generate an alignment-correctable signature by modeling alignment corrections for the set of correctable fields based on data from the full-field reference overlay signature in the one or more alignment fields using an alignment model for the current layer;

subtract the alignment-correctable signature from the full-field reference overlay signature to generate feedforward overlay corrections for the current layer when the one or more overlay reference layers are the same as the one or more alignment reference layers;

generate lithography tool corrections based on the feedforward overlay corrections; and provide the lithography tool corrections for the current layer to the lithography tool.

38. A method for determining feed forward data, comprising:

generating, with one or more processors, a reference overlay signature based on one or more overlay reference layers of a sample using overlay models for the one or more overlay reference layers;

extrapolating, with one or more processors, the reference overlay signature to a set of correctable fields for the exposure of a current layer of the sample to generate a full-field reference overlay signature;

identifying, with one or more processors, one or more alignment fields of the set of correctable fields including alignment targets to be used for alignment of a lithography tool for exposing the current layer, wherein the alignment targets are located in one or more alignment reference layers of the sample;

generating, with one or more processors, an alignment-correctable signature by modeling alignment corrections for the set of correctable fields based on data from the full-field reference overlay signature in the one or more alignment fields using an alignment model for the current layer;

subtracting, with one or more processors, the alignment-correctable signature from the full-field reference overlay signature to generate feedforward overlay corrections for the current layer when the one or more overlay reference layers are the same as the one or more alignment reference layers;

generating, with one or more processors, lithography tool corrections based on the feedforward overlay corrections; and providing the lithography tool corrections for the current layer to the lithography tool.

39. The method of claim 38, further comprising:

adjusting, with the lithography tool, exposure conditions of the set of correctable fields in the current layer based on the feed-forward overlay corrections.

* * * * *